US006342747B1

(12) United States Patent
Lee et al.

(10) Patent No.: US 6,342,747 B1
(45) Date of Patent: Jan. 29, 2002

(54) WING TYPE ULTRASONIC TRANSDUCER

(75) Inventors: Yang-Lae Lee; Pil-Woo Heo; Sang-Jin Park; Jae-Yun Kim; Eui-Su Lim, all of Daejeon-Si (KR)

(73) Assignee: Korea Institute of Machinery & Materials (KR)

( * ) Notice: Subject to any disclaimer, the term of this patent is extended or adjusted under 35 U.S.C. 154(b) by 0 days.

(21) Appl. No.: 09/512,219

(22) Filed: Feb. 24, 2000

(30) Foreign Application Priority Data

Aug. 5, 1999 (KR) ........................................... 99-32100

(51) Int. Cl.[7] ............................................... H01L 41/08
(52) U.S. Cl. ....................................... 310/228; 310/329
(58) Field of Search ................................ 310/328, 329, 310/337, 339, 344

(56) References Cited

U.S. PATENT DOCUMENTS 4,420,826 A * 12/1983 Marshall, Jr. et al. ...... 367/167
5,200,666 A * 4/1993 Walter et al. ............... 310/323

* cited by examiner

*Primary Examiner*—Brian Sircus
*Assistant Examiner*—Michael C. Zarroli
(74) *Attorney, Agent, or Firm*—Arent Fox Kintner Plotkin & Kahn, PLLC

(57) ABSTRACT

A wing type ultrasonic transducer is free from a reduction in the output power and has one ultrasonic generator. This ultrasonic generator has piezoelectric ceramic materials with two countermasses respectively coupled to the outside ends of the piezoelectric ceramic materials. A rod-like resonator is coaxially coupled to the outside end of each of the countermasses and is used to emit ultrasonic waves to a liquid in a radial direction. An immersible housing covers the ultrasonic generator so as to accomplish a water tightness of the ultrasonic generator. The rod-like resonator may be a solid resonator or hollow resonator. In addition, the rod-like resonator is integral times as long as a half-wavelength ($\lambda/2$) at an operating resonant frequency.

4 Claims, 1 Drawing Sheet

WING TYPE ULTRASONIC TRANSDUCER

BACKGROUND OF THE INVENTION

1. Field of the Invention

The present invention relates, in general, to wing type ultrasonic transducers and, more particularly, to a wing type ultrasonic transducer generating a high degree of output power, or ultrasonic energy, and being preferably usable in an ultrasonic cleaning process or an environmental treatment process.

2. Description of the Prior Art

As well known to those skilled in the art, an example of conventional wing type ultrasonic transducers, used in an ultrasonic cleaning process or an environmental treatment process, is a Langevin type transducer, consisting of a piezoelectric device interposed between two metal pieces tightened together by locking bolts.

Such a Langevin type transducer is not usable in water, and so it has to be attached to the wall of a cleaning tub. The Langevin type transducer is also designed to be operable in a longitudinal vibration mode, thus being regrettably limited in output power. That is, the ultrasonic energy output from the Langevin type transducer is undesirably limited.

In order to accomplish a desired high degree of output power, it is necessary to use a plurality of Langevin type transducers at the same time. However, when the Langevin type transducers, used at the same time, fail to accomplish a synchronous operation, the strain force caused by the vibration of a specified transducer may damage the neighboring transducers. In such a case, the transducers cannot be used for a desired lengthy period of time and are frequently changed with new ones.

Due to an intrinsic geometrical shape of the Langevin type transducers, the number of such transducers, used at the same time, is limited, and so it may be sometimes impossible to provide a desired output power.

U.S. Pat. No. 4,537,511 (1985) discloses a transducer, which is designed to produce a high degree of output power and to be usable in water. In the above U.S. transducer, a hollow rod-like resonator, which is integral times as long as a half-wavelength ($\lambda/2$) at an operating frequency, is connected to one end of an ultrasonic generator operated in a longitudinal vibration mode using a piezoelectric device. This transducer thus emits ultrasonic waves to a liquid in a radial direction.

The output power of the above U.S. transducer is preferably higher than that of a conventional Langevin type transducer. However, this U.S. transducer is problematic in that it cannot be used for a desired lengthy period of time since the transducer may be easily eroded at the hollow resonator. Therefore, it is necessary to frequently change the transducer with a new one. In addition, it is somewhat difficult to install the above U.S. transducer while attaching the transducer to a cleaning tub.

In an effort to increase the radial ultrasonic energy transmission of the transducer disclosed in U.S. Pat. No. 4,537,511, a transducer, having two piezo type ultrasonic generators at opposite ends of a hollow rod-like resonator, is proposed as disclosed in U.S. Pat. No. 5,200,666 (1993) and EP 455,837 (1991). In this transducer, the two piezo type ultrasonic generators are operated synchronously, while the hollow resonator is integral times as long as a half-wavelength ($\lambda/2$) at an operating frequency.

This transducer thus accomplishes a desired increase in the radial ultrasonic energy transmission.

However, when the two piezo type ultrasonic generators are not identified in both the resonant frequency and the impedance, the two ultrasonic generators have a difference in the amplitude of the longitudinal vibration. In such a case, the operational efficiency of the transducer is reduced. It is also very difficult to produce a transducer, with two piezo type ultrasonic generators having identified resonant frequency and impedance.

SUMMARY OF THE INVENTION

Accordingly, the present invention has been made keeping in mind the above problems occurring in the prior art, and an object of the present invention is to provide a wing type ultrasonic transducer, which generates a high degree of output power, or ultrasonic energy, and is effectively usable in water, and which is free from a reduction in the output power different from the conventional transducer with two ultrasonic generators necessarily identified in both the resonant frequency and the impedance.

In order to accomplish the above object, the present invention provides a wing type ultrasonic transducer, comprising: an ultrasonic generator having piezoelectric ceramic materials (which dimension is determined by resonant frequency and output power), with two countermasses respectively coupled to the outside ends of the piezoelectric ceramic materials (which dimension is determined by resonant frequency and output power); a rod-like resonator coaxially coupled to the outside end of each of the countermasses and used to emit ultrasonic waves to a liquid in a radial direction; and an immersible housing covering the ultrasonic generator so as to accomplish a water tightness of the ultrasonic generator.

In the present invention, the rod-like resonator may be a solid resonator or a hollow resonator. In addition, the rod-like resonator is integral times as long as a half-wavelength ($\lambda/2$) at an operating resonant frequency.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
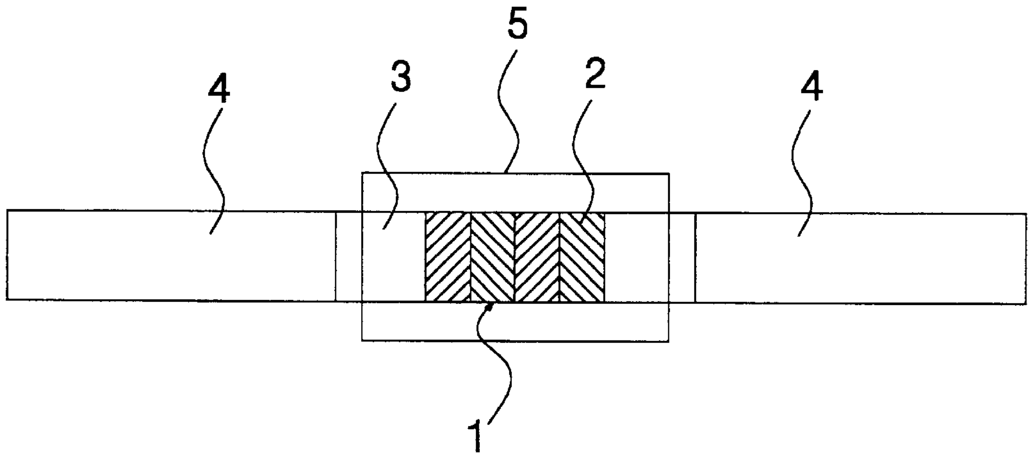
FIG. 1 is a view of a wing type ultrasonic transducer having a solid rod-like resonator in accordance with the primary embodiment of the present invention.

FIG. 1 is a view of a wing type ultrasonic transducer having a solid rod-like resonator in accordance with the primary embodiment of the present invention. As shown in the drawing, the wing type ultrasonic transducer of this invention consists of one ultrasonic generator with two rod-like resonators coupled to both ends of the ultrasonic generator. In a detailed description, the ultrasonic transducer, comprises an ultrasonic generator 1, which has piezoelectric ceramic materials (which dimension is determined by resonant frequency and output power) 2, with two countermasses 3 respectively coupled to the outside ends of the piezoelectric ceramic materials (which dimension is determined by resonant frequency and output power) 2. Each pair of piezoelectric ceramic devices 2 consists of two piezoelectric devices. A rod-like resonator 4 is coaxially coupled to the outside end of each countermass 3 and emits ultrasonic waves to a liquid in a radial direction. An immersible housing 5 covers the ultrasonic generator 1 so as to accomplish a water tightness of the ultrasonic generator 1.

In the primary embodiment, each of the rod-like resonators 4 is a solid resonator, which is integral times as long as a half-wavelength (λ/2) at an operating resonant frequency.

Figure 2:
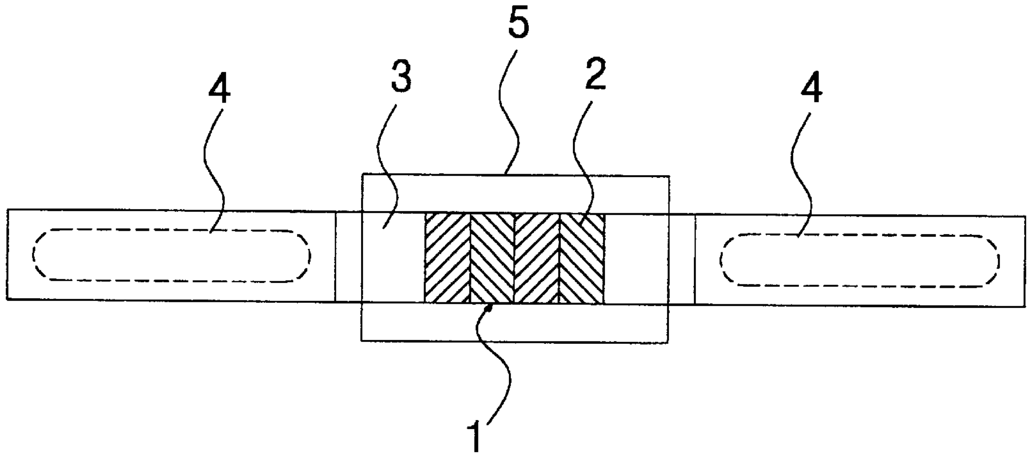
FIG. 2 is a view of a wing type ultrasonic transducer having a hollow rod-like resonator in accordance with the second embodiment of the present invention.

FIG. 2 is a view of a wing type ultrasonic transducer having a hollow rod-like resonator in accordance with the second embodiment of the present invention. In the second embodiment, the general shape of the transducer remains the same as that described for the primary embodiment of FIG. 1, but each of the rod-like resonators 4 is a hollow resonator different from the solid resonator of the primary embodiment.

The hollow resonator 4 of the second embodiment is improved in flexibility in comparison with the solid resonator of the primary embodiment, and so it is possible to more easily emit ultrasonic waves to a liquid in a radial direction.

As described above, the present invention provides a wing type ultrasonic transducer. The transducer of this invention is remarkably improved in both the structure and the operational effect in comparison with conventional ultrasonic transducers as follows.

That is, the conventional transducer disclosed in U.S. Pat. No. 4,537,511 (1985) has a hollow rod-like resonator connected to one end of an ultrasonic generator and emits ultrasonic waves to a liquid in a radial direction. However, this U.S. transducer cannot be used for a desired lengthy period of time since it may be easily eroded at the hollow resonator. Therefore, this transducer has to be frequently changed with a new one. In addition, it is very difficult to install this transducer while attaching the transducer to a cleaning tub.

On the other hand, the conventional transducer disclosed in U.S. Pat. No. 5,200,666 (1993) has two piezo type ultrasonic generators at opposite ends of a hollow rod-like resonator. In this transducer, the two piezo type ultrasonic generators have to be operated synchronously. However, the two ultrasonic generators may fail to be operated synchronously since it is difficult to allow the two ultrasonic generators to have equal characteristics in both the resonant frequency and the impedance. When the two ultrasonic generators are not identified in both the resonant frequency and the impedance, they have a difference in the amplitude of the longitudinal vibration and reduce the operational efficiency of the transducer.

Meanwhile, the transducer of this invention effectively generates a high degree of output power, or ultrasonic energy. It is also easy to design and produce the countermass of the transducer of this invention, and so the operational reliability of this transducer is improved. In addition, the transducer of this invention uses one ultrasonic generator, and so this transducer is free from a reduction in the output power different from the conventional transducer with two ultrasonic generators necessarily identified in both the resonant frequency and the impedance. Another advantage of this invention resides in that the transducer is easily installed and effectively usable in water since the ultrasonic generator is watertightly covered with an immersible housing.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A wing type ultrasonic transducer, comprising:

an ultrasonic generator having piezoelectric ceramic materials, said ultrasonic generator having dimensions that are determined by resonant frequency and output power, with two countermasses respectively coupled to outside ends of said piezoelectric ceramic materials;

a rod-like resonator coaxially coupled to an outside end of each of said countermasses and used to emit ultrasonic waves to a liquid in a radial direction; and an immersible housing covering said ultrasonic generator so as to accomplish a water tightness of the ultrasonic generator.

2. The ultrasonic transducer according to claim 1, wherein said rod-like resonator is a solid resonator.

3. The ultrasonic transducer according to claim 1, wherein said rod-like resonator is a hollow resonator.

4. The ultrasonic transducer according to claim 1, wherein said rod-like resonator is integral times as long as a half-wavelength (λ/2) at an operating resonant frequency.

* * * * *